United States Patent
Sheng et al.

(10) Patent No.: US 11,776,763 B2
(45) Date of Patent: Oct. 3, 2023

(54) PRINTABLE CURVED-SURFACE PEROVSKITE SOLAR CELL AND PREPARATION METHOD THEREOF

(71) Applicant: HUBEI WONDER SOLAR LIMITED LIABILITY COMPANY, Ezhou (CN)

(72) Inventors: Yusong Sheng, Ezhou (CN); Jiakun Dai, Ezhou (CN)

(73) Assignee: HUBEI WONDER SOLAR LIMITED LIABILITY COMPANY, Ezhou (CN)

( * ) Notice: Subject to any disclaimer, the term of this patent is extended or adjusted under 35 U.S.C. 154(b) by 0 days.

(21) Appl. No.: 17/688,812

(22) Filed: Mar. 7, 2022

(65) Prior Publication Data
US 2022/0199332 A1    Jun. 23, 2022

Related U.S. Application Data

(63) Continuation of application No. PCT/CN2020/137186, filed on Dec. 17, 2020.

(51) Int. Cl.
*H01G 9/02*    (2006.01)
*H10K 71/60*    (2023.01)
(Continued)

(52) U.S. Cl.
CPC ......... *H01G 9/2009* (2013.01); *H01G 9/0032* (2013.01); *H01G 9/0036* (2013.01); *H10K 71/60* (2023.02)

(58) Field of Classification Search
None
See application file for complete search history.

(56) References Cited

U.S. PATENT DOCUMENTS

2003/0175411 A1   9/2003   Kodas et al.
2018/0248135 A1   8/2018   Yu et al.
2019/0319145 A1   10/2019  Cheng et al.

FOREIGN PATENT DOCUMENTS

CN   106129251 A       11/2016
CN   107146847 A   *   9/2017
(Continued)

OTHER PUBLICATIONS

English translation of CN 107146847 (Year: 2017).*
(Continued)

*Primary Examiner* — Xiaoming Liu
(74) *Attorney, Agent, or Firm* — True Shepherd LLC; Andrew C. Cheng (57) ABSTRACT

The present disclosure provides a printable curved-surface perovskite solar cell, including a curved-surface conductive substrate, a porous electron transport layer, a porous insulation layer, a porous back electrode layer and a perovskite filler. The curved-surface conductive substrate includes a curved-surface transparent substrate and a conductive layer deposited on the curved-surface transparent substrate. The porous electron transport layer, the porous insulation layer and the porous back electrode layer are sequentially deposited on the conductive layer from bottom to top. The perovskite filler is filled in pores of the porous electron transport layer, the porous insulation layer and the porous back electrode layer. The present disclosure further provides a method for preparing the printable curved-surface perovskite solar cell.

8 Claims, 7 Drawing Sheets

(51) Int. Cl.
*H01G 9/20* (2006.01)
*H01G 9/00* (2006.01)

(56) References Cited

FOREIGN PATENT DOCUMENTS

| | | |
|---|---|---|
| CN | 108365106 A | 8/2018 |
| CN | 109860400 A | 6/2019 |
| CN | 110473973 A | 11/2019 |
| CN | 111223994 A | 6/2020 |

OTHER PUBLICATIONS

Zhen et al. "Strategies for Modifying TiO2 Based Electron Transport Layers to Boost Perovskite Solar Cells" ACS sustainable Chen. 2019, 7, 4586-4618 (Year: 2019).*

* cited by examiner

PRINTABLE CURVED-SURFACE PEROVSKITE SOLAR CELL AND PREPARATION METHOD THEREOF

CROSS-REFERENCE TO RELATED APPLICATIONS

This application is a continuation of International Patent Application No. PCT/CN2020/137186 with of filing date of Dec. 17, 2020, designating the United States, now pending. The content of the aforementioned application, including any intervening amendments thereto, is incorporated herein by reference.

TECHNICAL FIELD

The present disclosure relates to a printable curved-surface perovskite solar cell and a preparation method thereof.

BACKGROUND

Along with the rapid development of society, the demand on energy is increasing, and main energy is gradually switched from fossil energy to electrical energy. Currently, along with the popularization of electrical devices and smart devices, diversified electricity supply forms are demanded. A portable self-generating power source is used to compensate for a small capacity of an energy-storage power source, so it is very important to commonly-used electronic products. Solar energy is inexhaustible and widespread, so a solar cell has been considered as a portable self-generating power source of great potential.

A mainstream solar cell technology is mainly used in a large-scale photovoltaic power station to achieve a large-scale power generation system, but a portable solar cell technology is relatively under-developed. Considering the trouble caused when a battery of a vehicle or a mobile phone runs out as well as the demand on electricity in outdoor activities, the portable solar cell technology becomes very importable. Especially, the solar cell may be integrated with a vehicle roof, a housing of the mobile phone or a portable tent. Hence, the portable solar cell technology has a bright future.

Currently, a mainstream crystalline silicon solar cell technology has matured, but due to a mechanical property of a silicon-based material itself, there is a great challenge for the integration of the crystalline silicon solar cell technology with the other device to provide a portable power source. An organic solar cell technology has a remarkable technical advantage in terms of portable power source, but its photoelectric conversion efficiency is insufficient. A perovskite material has advantages of an inorganic semiconductor material and an organic semiconductor material in terms of a semiconductor property and a machining property, so a perovskite solar cell technology has developed rapidly. Photoelectric conversion efficiency of a perovskite solar cell with a planar substrate is up to 25.2%, so it is important to integrate the perovskite solar cell with the other device.

CN107146847A has disclosed a carbon counter electrode perovskite solar cell, which includes, from bottom to top, a transparent conductive substrate, a photo anode, an insulation layer, a first carbon layer and a second carbon layer. The first carbon layer is a porous carbon layer, and the second carbon layer is a low-temperature carbon layer. The perovskite solar cell is prepared as follows. (1) A dense layer is formed on the transparent conductive substrate. (2) A first titanium dioxide ($TiO_2$) mesoporous layer and a zirconium dioxide ($ZrO_2$) insulation layer are formed sequentially on the dense layer through silk-screen printing. (3) The first carbon layer is formed on the insulation layer. (4) A perovskite precursor slurry is dripped onto a surface of the first carbon layer so as to fill in pores of the dense layer, the $TiO_2$ mesoporous layer, the $ZrO_2$ insulation layer and the first carbon layer. (5) The second carbon layer is formed on the first carbon layer. The substrate of the perovskite solar cell is of a sheet-like shape, so it is impossible to prepare a curved-surface perovskite solar cell through this method.

CN108550705A has disclosed a perovskite solar cell module, which includes a conductive substrate, a perovskite light absorption layer and a counter electrode. A hole blocking layer, an electron transport layer and an insulation layer are arranged between the conductive substrate and the perovskite light absorption layer, and a hole transport layer is arranged between the counter electrode and the perovskite light absorption layer. The perovskite solar cell is prepared as follows. A $TiO_2$ dense layer is formed on a Fluorine-doped Tin Oxide (FTO) glass substrate. Next, a TiO2 slurry is applied onto the dense layer through silk-screen printing as the electron transport layer, with terpilenol as a solvent. Next, a $ZrO_2$ slurry is applied onto the electron transport layer through silk-screen printing, with terpilenol as a solvent. Next, a perovskite precursor slurry, i.e., $CH_3NH_3PbI_3$, with dimethyl sulfoxide and dimethyl formamide (DMF) as solvents, and the perovskite light absorption layer is formed through spinning. Then, a carbon slurry is applied onto the perovskite light absorption layer through silk-screen printing as the hole transport layer with terpilenol as a solvent, and the counter electrode is formed through a normal temperature release-type conductive adhesive tape, so as to obtain the perovskite solar cell. The perovskite solar cell needs to be provided with the hole blocking layer and the hole transport layer, and its substrate is of a sheet-like shape, so it is impossible to prepare the curved-surface perovskite solar cell through this method.

SUMMARY

An object of the present disclosure is to provide a printable curved-surface perovskite solar cell with a curved substrate, so as to facilitate the integration with the other devices, thereby to enlarge an application range of the perovskite solar cell. Another object of the present disclosure is to provide a method for preparing the printable curved-surface perovskite solar cell, so as to improve uniformity of each functional layer of the curved-surface perovskite solar cell.

In one aspect, the present disclosure provides in some embodiments a printable curved-surface perovskite solar cell, including a curved-surface conductive substrate, a porous electron transport layer, a porous insulation layer, a porous back electrode layer and a perovskite filler. The curved-surface conductive substrate includes a curved-surface transparent substrate and a conductive layer deposited on the curved-surface transparent substrate. The porous electron transport layer, the porous insulation layer and the porous back electrode layer are sequentially deposited on the conductive layer from bottom to top. The perovskite filler is filled in pores of the porous electron transport layer, the porous insulation layer and the porous back electrode layer.

In a possible embodiment of the present disclosure, the porous electron transport layer has a thickness of 300 nm to 1000 nm, the porous insulation layer has a thickness of 1 μm to 6 μm, and the porous back electrode layer has a thickness of 10 μm to 40 μm.

In another aspect, the present disclosure provides in some embodiments a method for preparing a printable curved-surface perovskite solar cell, including: (1) etching a cleaned curved-surface conductive substrate through laser to form an etching line P1; (2) applying a porous electron transport layer slurry onto a conductive layer of the curved-surface conductive substrate with the etching line P1, applying a first hot melt adhesive onto the porous electron transport layer slurry to form a first hot melt adhesive film, and peeling off the first hot melt adhesive film to obtain a first preform with a porous electron transport layer; (3) applying a porous insulation layer slurry onto the porous electron transport layer of the first preform, applying a second hot melt adhesive onto the porous insulation layer slurry to form a second hot melt adhesive film, and peeling off the second hot melt adhesive film to obtain a second preform with a porous insulation layer; (4) applying a porous back electrode layer slurry onto the porous insulation layer of the second preform to form a porous back electrode layer, thereby to obtain a third preform with the porous back electrode layer; and (5) applying a perovskite precursor slurry onto the porous back electrode layer of the third preform in such a manner that the perovskite precursor slurry is filled in pores of the porous electron transport layer, the porous insulation layer and the porous back electrode layer, to obtain the printable curved-surface perovskite solar cell.

In a possible embodiment of the present disclosure, the first hot melt adhesive and the second hot melt adhesive are each independently selected from polyurethane, a polyolefin elastomer, polyethersulfone resin, copolyamide, an ethylene-acrylic acid copolymer or an ethylene-vinyl acetate copolymer.

In a possible embodiment of the present disclosure, the porous electron transport layer slurry includes an electron transport material and terpilenol, and a solid content of the electron transport material is 2 wt % to 10 wt % in the porous electron transport layer slurry. Terpilenol contains α-terpilenol, and a content of α-terpilenol in terpilenol is more than 30 wt %. The electron transport material is one or more selected from a group consisting of titanium dioxide, tin dioxide, zinc oxide and barium stannate.

In a possible embodiment of the present disclosure, the porous insulation layer slurry includes an insulation material, ethyl cellulose and terpilenol, a mass ratio of the insulation material to ethyl cellulose is 1:0.15 to 1:0.4, a mass ratio of the insulation material to terpilenol is 1:2 to 1:6, the insulation material is one or more selected from the group consisting of zirconium dioxide, silicon dioxide, aluminium oxide and barium titanate, terpilenol contains α-terpilenol, and a content of α-terpilenol in terpilenol is more than 30 wt %. The porous back electrode layer slurry includes graphite, carbon black, zirconium dioxide, ethyl cellulose and terpilenol. A mass ratio of graphite to carbon black is 1:0.15 to 1:0.5, a mass ratio of graphite to zirconium dioxide is 1:0.1 to 1:0.5, a mass ratio of graphite to ethyl cellulose is 1:0.1 to 1:0.5, and a mass ratio of graphite to terpilenol is 1:2 to 1:6.

In a possible embodiment of the present disclosure, the porous insulation layer slurry further includes glacial acetic acid, a mass ratio of the insulation material to glacial acetic acid is 1:0.05 to 1, the porous back electrode layer slurry further includes glacial acetic acid, and a mass ratio of graphite to glacial acetic acid is 1:0.01 to 0.6.

In a possible embodiment of the present disclosure, prior to (3), the method further includes annealing the first preform with the porous electron transport layer at a temperature of 300° C. to 600° C. for 10 min to 60 min.

In a possible embodiment of the present disclosure, the method further includes etching the second preform with the porous insulation layer through laser to form an etching line P2. The etching line P2 is located at a left side of, and tangent to, the etching line P1, and the etching line P2 has a width of 0.3 mm to 1 mm.

In a possible embodiment of the present disclosure, the method further includes etching the third preform with the porous back electrode layer through layer to form an etching line P3, and annealing the third preform at a temperature of 300° C. to 600° C. for 10 min to 60 min. The etching line P3 is located at a left side of, and tangent to, the etching line P2, and the etching line P3 has a width of 0.05 mm to 0.3 mm.

According to the embodiments of the present disclosure, the printable curved-surface perovskite solar cell has the curved substrate, so as to facilitate the integration with the other device (e.g., a vehicle roof, a housing of a mobile phone or a portable tent), thereby to enlarge an application range of the printable curved-surface perovskite solar cell. In addition, the hot melt adhesive film is applied onto the slurry, so as to fix the slurry onto the curved substrate and prevent the accumulation of the slurry, thereby to improve the uniformity of each functional layer. Moreover, through adjusting a composition of the slurry, it is able to provide the slurry with appropriate fluidity, thereby to improve the uniformity of each functional layer.

REFERENCE SIGN LIST 1 curved-surface transparent substrate
2 conductive layer 3 porous electron transport layer
4 porous insulation layer
5 porous back electrode layer

DETAILED DESCRIPTION

The present disclosure will be described hereinafter in conjunction with the drawings and embodiments. The following embodiments are for illustrative purposes only, but shall not be used to limit the scope of the present disclosure.

<Printable Curved-Surface Perovskite Solar Cell>

Figure 1:
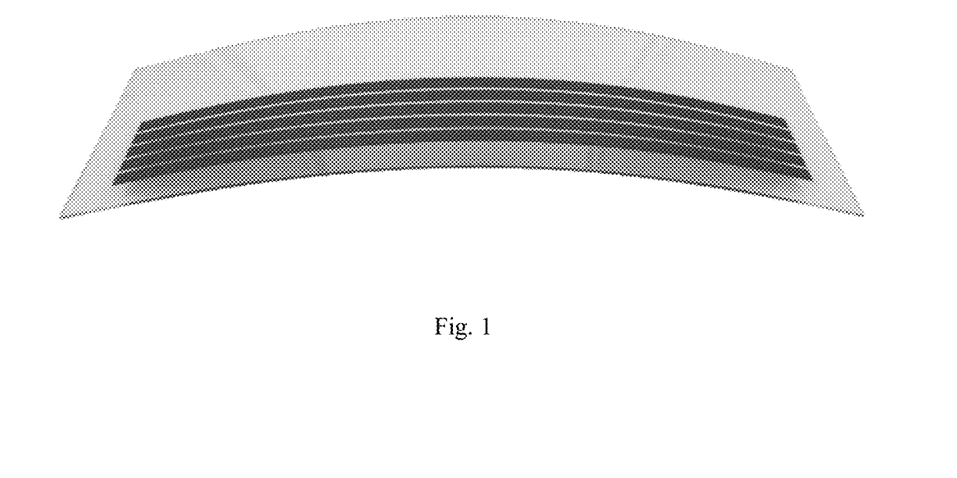
FIG. 1 is a schematic view showing a printable curved-surface perovskite solar cell obtained according to Example 1 of the present disclosure.

As shown in FIG. 1, the present disclosure provides in some embodiments a printable curved-surface perovskite solar cell, which includes a curved substrate. As compared with a conventional printable curved-surface perovskite solar cell with a planar substrate, in the embodiments of the present disclosure, the fluidity of a printed wet film increases significantly, so it is very difficult to prepare the perovskite solar cell. Although a printable planar perovskite solar cell has already been widely used, the printable curved-surface perovskite solar cell has not been reported yet.

The printable curved-surface perovskite solar cell includes a curved-surface conductive substrate, a porous electron transport layer, a porous insulation layer, a porous back electrode layer and a perovskite filler. Actually, each of the porous electron transport layer, the porous insulation layer and the porous back electrode layer also has a curved structure. The printable curved-surface perovskite solar cell may further include a package layer. In some embodiments of the present disclosure, the printable curved-surface perovskite solar cell includes the curved-surface conductive substrate, the porous electron transport layer, the porous insulation layer, the porous back electrode layer and the perovskite filler. In some other embodiments of the present disclosure, the printable curved-surface perovskite solar cell includes the curved-surface conductive substrate, the porous electron transport layer, the porous insulation layer, the porous back electrode layer, the perovskite filler and the package layer.

Curved-Surface Conductive Substrate

In the embodiments of the present disclosure, the curved-surface conductive substrate may include a curved-surface transparent substrate and a conductive layer, and the conductive layer may be deposited on the curved-surface transparent substrate. In a possible embodiment of the present disclosure, the curved-surface conductive substrate includes the curved-surface transparent substrate and the conductive layer deposited on the curved-surface transparent substrate. The word "curved surface" refers to a trajectory of a line generated when the line moves in a space continuously, and it may be a ruled surface or a hyperbolic surface. The ruled surface includes, but not limited to, one of a cylindrical surface, a conical surface, an elliptic cylindrical surface, an elliptic conical surface, a cone-like surface and a column-like surface, and the hyperbolic surface includes, but not limited to, a spherical surface or a ring surface.

The curved-surface transparent substrate may be made of transparent glass or a transparent polymer. Examples of the transparent polymer include, but not limited to, polyvinyl chloride, polymethyl methacrylate, polycarbonate, polystyrene, polyethylene and ethylene-vinyl acetate copolymer. In a possible embodiment of the present disclosure, the curved-surface transparent substrate is a transparent glass substrate.

The conductive layer may be made of FTO, tin-doped indium oxide, aluminium-doped zinc oxide, graphene or a transparent metal conductive thin film. In a possible embodiment of the present disclosure, the conductive layer is an FTO layer.

Porous Electron Transport Layer

The porous electron transport layer may be deposited onto the conductive layer, and it may also have a curved surface. The word "curved surface" may be a ruled surface or a hyperbolic surface. The ruled surface includes, but not limited to, one of a cylindrical surface, a conical surface, an elliptic cylindrical surface, an elliptic conical surface, a cone-like surface and a column-like surface, and the hyperbolic surface includes, but not limited to, a spherical surface or a ring surface. In a possible embodiment of the present disclosure, the curved surface is a cylindrical surface.

The porous electron transport layer may be made of titanium dioxide, tin dioxide, zinc oxide or barium stannate. In a possible embodiment of the present disclosure, the porous electron transport layer is made of titanium dioxide. The porous electron transport layer has a thickness of 300 nm to 1000 nm, e.g., 400 nm to 800 nm, particularly 500 nm to 600 nm. The porous electron transport layer has a pore size of 2 nm to 100 nm, e.g., 15 nm to 50 nm, particularly 25 nm to 35 nm. The porous electron transport layer has a grain size of 10 nm to 50 nm, e.g., 15 nm to 35 nm, particularly 25 nm to 35 nm.

Porous Insulation Layer

The porous insulation layer may be deposited onto the porous electron transport layer, and it may also have a curved surface. The word "curved surface" may be a ruled surface or a hyperbolic surface. The ruled surface includes, but not limited to, one of a cylindrical surface, a conical surface, an elliptic cylindrical surface, an elliptic conical surface, a cone-like surface and a column-like surface, and the hyperbolic surface includes, but not limited to, a spherical surface or a ring surface. In a possible embodiment of the present disclosure, the curved surface is a cylindrical surface.

The porous insulation layer may be made of zirconium dioxide, silicon dioxide, aluminium oxide or barium titanate. In a possible embodiment of the present disclosure, the porous insulation layer is made of zirconium dioxide. The porous insulation layer has a thickness of 1 μm to 6 μm, e.g., 2 μm to 5 μm, particularly 3 μm to 4 μm. The porous insulation layer has a pore size of 0 nm to 500 nm, e.g., 30 nm to 200 nm, particularly 50 nm to 100 nm. The porous insulation layer has a grain size of 10 nm to 500 nm, e.g., 30 nm to 200 nm, particularly 100 nm to 200 nm.

Porous Back Electrode Layer

The porous back electrode layer may be deposited onto the porous insulation layer, and it may also have a curved surface. The word "curved surface" may be a ruled surface or a hyperbolic surface. The ruled surface includes, but not limited to, one of a cylindrical surface, a conical surface, an elliptic cylindrical surface, an elliptic conical surface, a cone-like surface and a column-like surface, and the hyperbolic surface includes, but not limited to, a spherical surface or a ring surface. In a possible embodiment of the present disclosure, the curved surface is a cylindrical surface.

The porous back electrode layer may be made of a porous electrode material, e.g., a porous carbon electrode material or a porous conductive oxide electrode material. Examples of the porous carbon electrode material include, but not limited to, graphite, carbon black, active carbon, graphene and carbon nanotube. Examples of the porous conductive oxide electrode material include, but not limited to, FTO, tin-doped indium oxide, and aluminium-doped zinc oxide. In a possible embodiment of the present disclosure, the porous back electrode layer is made of graphite, carbon black and zirconium dioxide. A mass ratio of graphite to carbon black is 1:0.15 to 1:0.5, e.g., 1:0.25 to 1:0.4, particularly 1:0.3 to 1:0.35. A mass ratio of graphite to zirconium dioxide is 1:0.1 to 1:0.5, e.g., 1:0.1 to 1:0.3, particularly 1:0.15 to 1:0.2. In this way, it is able to provide a better curing effect and a better strengthening effect, and improve quality of the film, thereby to improve an electrical property and a filling property of the film.

The porous back electrode layer has a thickness of 10 μm to 50 μm, e.g., 15 μm to 40 μm, particularly 20 μm to 30 μm. A graphite sheet of the porous back electrode layer has a size of 1 μm to 100 μm, e.g., 5 μm to 50 μm, particularly 10 μm to 20 μm.

Perovskite Filler

The perovskite filler is filled in pores of the porous electron transport layer, the porous insulation layer and the porous back electrode layer, and it is a compound with a structure expressed by ABX3 (I), where A is a cation formed by alkylamine, formamidine or an alkali metal, e.g., a cation formed by methylamine, formamidine, caesium or rubidium, particularly a cation formed by methylamine; B is a cation formed by plumbum or tin, e.g., a cation formed by plumbum; and X is an anion formed by iodine, bromine, chlorine or pseudo halogen, e.g., an iodide ion. Examples of pseudo halogen include, but not limited to, CN, SCN, SeCN, OCN and SCSN. In a possible embodiment of the present disclosure, a compound having a perovskite structure is $CH_3NH_3PbI_3$.

Package Layer

The package layer may include a hot melt adhesive film covering the porous back electrode layer and a flexible back plate covering the hot melt adhesive film. The hot melt adhesive film may be made of polyurethane or ethylene-vinyl acetate copolymer, and it may also have a curved surface. The word "curved surface" may be a ruled surface or a hyperbolic surface. The ruled surface includes, but not limited to, one of a cylindrical surface, a conical surface, an elliptic cylindrical surface, an elliptic conical surface, a cone-like surface and a column-like surface, and the hyperbolic surface includes, but not limited to, a spherical surface or a ring surface. In a possible embodiment of the present disclosure, the curved surface is a cylindrical surface. The flexible back plate may be a flexible functional film having a water-proof insulation function, and it may also have a curved surface. The word "curved surface" may be a ruled surface or a hyperbolic surface. The ruled surface includes, but not limited to, one of a cylindrical surface, a conical surface, an elliptic cylindrical surface, an elliptic conical surface, a cone-like surface and a column-like surface, and the hyperbolic surface includes, but not limited to, a spherical surface or a ring surface. In a possible embodiment of the present disclosure, the curved surface is a cylindrical surface.

<Preparation Method>

The present disclosure provides in some embodiments a method for preparing a printable curved-surface perovskite solar cell, which includes: (1) a step of forming an etching line P1; (2) a step of forming a porous electron transport layer; (3) a step of forming a porous insulation layer; (4) a step of forming a porous back electrode layer; and (5) a step of filling a perovskite filler. In a possible embodiment of the present disclosure, the method further includes (6) a packaging step. In the embodiments of the present disclosure, the porous electron transport layer, the porous insulation layer and the porous back electrode layer may be annealed independently, or two or three of them may be annealed together. Detailed description will be given as follows.

Step of Forming the Etching Line P1

A cleaned curved-surface conductive substrate is etched through laser, so as to form the etching line P1.

Prior to etching, the curved-surface conductive substrate needs to be cleaned, so as to remove stains on a surface of the curved-surface conductive substrate. To be specific, the curved-surface conductive substrate is immersed into a detergent for ultrasonic cleaning, and immersed into alcohol for cleaning, and then dried. The detergent may be one or more selected from the group consisting of Walch, Mr. Muscle, JustClean, LOPO, Cleafe, White Cat, Liby, Kleen MCT511 and Hellmanex®III, e.g., one or more selected from the group consisting of Cleafe, White Cat, Liby, Kleen MCT511 and Hellmanex®III, particularly Hellmanex®III. The curved-surface conductive substrate is immersed into the detergent for ultrasonic cleaning for 5 min to 30 min, e.g., 10 min to 25 min, particularly 15 min to 20 min. The curved-surface conductive substrate is immersed into alcohol for cleaning for 1 min to 20 min, e.g., 3 min to 15 min, particularly 3 min to 10 min. The curved-surface conductive substrate is dried at a temperature of 50° C. to 80° C., e.g., 55° C. to 75° C., particularly 55° C. to 60° C. In this way, it is able to thoroughly remove the stains on the curved-surface conductive substrate.

The curved-surface conductive substrate may be etched through a nanosecond laser etching machine, so as to form the etching line P1. The etching line P1 may have a width of 0.02 mm to 0.15 mm, e.g., 0.03 mm to 0.1 mm, particularly 0.05 mm to 0.1 mm.

The curved-surface conductive substrate with the etching line P1 is cleaned. To be specific, the curved-surface conductive substrate with the etching line P1 is immersed into deionized water for ultrasonic cleaning, and immersed into alcohol for ultrasonic cleaning, and then dried until no water and spot-like impurities remain on a surface thereof. The curved-surface conductive substrate is immersed in the deionized water for ultrasonic cleaning for 5 min to 30 min, e.g., 10 min to 25 min, particularly 15 min to 20 min. The curved-surface conductive substrate is immersed in alcohol for ultrasonic cleaning for 1 min to 20 min, e.g., 3 min to 15 min, particularly 3 min to 10 min. The curved-surface conductive substrate is dried at a temperature of 50° C. to 80° C., e.g., 55° C. to 75° C., particularly 60° C. to 70° C. In this way, it is able to ensure the cleanliness for the subsequent deposition.

The cleaned curved-surface conductive substrate with the etching line P1 is treated with ultraviolet light and ozone for 5 min to 30 min, e.g., 10 min to 20 min, particularly 10 min to 15 min, so as to remove organic matters on the surface of the curved-surface conductive substrate, thereby to improve wettability of the surface.

Step of Forming the Porous Electron Transport Layer

A porous electron transport layer slurry is applied onto the conductive layer of the curved-surface conductive substrate with the etching line P1, a first hot melt adhesive is applied onto the porous electron transport layer slurry to form a first hot melt adhesive film, and then the first hot melt adhesive film is peeled off to obtain a first preform with the porous electron transport layer. To be specific, the porous electron transport layer slurry is applied evenly onto the conductive layer of the curved-surface conductive substrate with the etching line P1. Next, the first hot melt adhesive is applied evenly onto the porous electron transport layer slurry and dried to obtain the first hot melt adhesive film. Then, the first hot melt adhesive film is peeled off to obtain the first preform with the porous electron transport layer. The first hot melt adhesive film may be peeled off through any known method in the art.

The porous electron transport layer slurry may be applied onto the conductive layer of the curved-surface conductive substrate with the etching line P1 through silk-screen printing, slit coating, scraping, ink-jet printing, or spray deposition. In a possible embodiment of the present disclosure, the porous electron transport layer slurry is applied onto the conductive layer of the curved-surface conductive substrate with the etching line P1 through silk-screen printing. The sill-screen printing may be achieved through a curved-surface silk-screen printer.

The porous electron transport layer slurry may include an electron transport material and terpilenol. The electron transport material may be one of titanium dioxide, tin dioxide, zinc oxide or barium stannate, e.g., titanium dioxide. The electron transport material has a pore size of 2 nm to 50 nm, e.g., 15 nm to 35 nm, particularly 25 nm to 35 nm, and it has a grain size of 10 nm to 40 nm, e.g., 15 nm to 35 nm, particularly 25 nm to 35 nm. Terpilenol may be one or more of α-terpilenol, β-terpilenol and γ-terpilenol. In a possible embodiment of the present disclosure, terpilenol contains α-terpilenol, or terpilenol is α-terpilenol. A content of α-terpilenol in terpilenol is more than 30 wt %, e.g., more than 80 wt %, particularly more than 90 wt %. The slurry containing α-terpilenol is jelly-like at a room temperature, but it has excellent fluidity when the temperature is greater than 40° C., so it is able to facilitate the formation of the porous electron transport layer evenly on the curved-surface conductive substrate. In a possible embodiment of the present disclosure, the porous electron transport layer slurry includes titanium dioxide and α-terpilenol. Titanium dioxide may be provided through a titanium dioxide slurry from Greatcellsolar, e.g., NR-18 or NR-30, particularly NR-30. A solid content of the electron transport material in the porous electron transport layer slurry may be 2 wt % to 10 wt %, e.g., 3 wt % to 7 wt %, particularly 4 wt % to 5 wt %.

The porous electron transport layer slurry is prepared through mixing. In a possible embodiment of the present disclosure, subsequent to mixing, the porous electron transport layer slurry is further subjected to vacuum defoaming for 20 min to 80 min, e.g., 30 min to 70 min, particularly 40 min to 50 min, so as to improve the uniformity of the resultant film.

After the porous electron transport layer slurry has been applied onto the conductive layer of the curved-surface conductive substrate with the etching line P1, it may be rested at a room temperature for 3 min to 20 min, e.g., 5 min to 15 min, particularly 10 min to 15 min, and then the first hot melt adhesive is applied onto the porous electron transport layer slurry. Also, the first hot melt adhesive may be applied onto the porous electron transport layer slurry, and then rested at the room temperature. In addition, the first hot melt adhesive may be directly applied without any rest at the room temperature. Through the rest, it is able to improve flatness of a surface of the resultant thin film.

The first hot melt adhesive may be one of polyurethane, a polyolefin elastomer, polyethersulfone resin, copolyamide, an ethylene-acrylic acid copolymer or an ethylene-vinyl acetate copolymer. In a possible embodiment of the present disclosure, the first hot melt adhesive is polyurethane, e.g., HSL-U60 from Shenzhen Henshenglong Adhesive Product Co., Ltd, XJU-5C from Shanghai Xingxia Polymer Product Co., Ltd, or LV368B-10-FQ from Jiangsu Hehe New Material Co., Ltd. In a possible embodiment of the present disclosure, the first hot melt adhesive is XJU-5C from Shanghai Xingxia Polymer Product Co., Ltd. Through the first hot melt adhesive, it is able to firmly attach the porous electron transport layer slurry onto the curved-surface conductive substrate, improve the uniformity of the porous electron transport layer, facilitate the removal of the first hot melt adhesive film, and prevent the performance of the perovskite solar cell from being adversely affected.

The hot melt adhesive may be dried in a vacuum oven at a temperature of 80° C. to 130° C., e.g., 90° C. to 120° C., particularly 90° C. to 110° C., for 5 min to 20 min, e.g., 10 min to 20 min, particularly 13 min to 17 min. In this way, it is able to dry the hot melt adhesive into a solid thin film for removal, and facilitate the deposition of the porous electron transport layer onto the curved-surface conductive substrate.

In some embodiments of the present disclosure, the first preform with the porous electron transport layer is annealed at a temperature of 300° C. to 600° C., e.g., 400° C. to 600° C., particularly 450° C. to 550° C., for 10 min to 60 min, e.g., 20 min to 50 min, particularly 20 min to 40 min, so as to improve the performance of the porous electron transport layer.

Step of Forming the Porous Insulation Layer

A porous insulation layer slurry is applied onto the porous electron transport layer of the first preform, a second hot melt adhesive is applied onto the porous insulation layer slurry to form a second hot melt adhesive film, and then the second hot melt adhesive film is peeled off to obtain a second preform with the porous insulation layer. To be specific, the porous insulation layer slurry is applied evenly onto the porous electron transport layer of the first preform. Next, the second hot melt adhesive is applied evenly onto the porous insulation layer slurry and dried to obtain the second hot melt adhesive film. Then, the second hot melt adhesive film is peeled off to obtain the second preform with the porous insulation layer. The second hot melt adhesive film may be peeled off through any known method in the art.

The porous insulation layer slurry may be applied onto the porous electron transport layer of the first preform through silk-screen printing, slit coating, scraping, ink-jet printing, or spray deposition. In a possible embodiment of the present disclosure, the porous insulation layer slurry is applied onto the porous electron transport layer of the first preform through silk-screen printing. The sill-screen printing may be achieved through a curved-surface silk-screen printer.

The porous insulation layer slurry may include an insulation material, ethyl cellulose and terpilenol. In some embodiments of the present disclosure, the porous insulation layer slurry may further include glacial acetic acid. The porous insulation layer slurry may be dispersed through a planetary ball mill, a high speed shearing machine, a sand mill, a rotary and revolutionary mixer, or a nano mill. In addition, the porous insulation layer slurry is further subjected to vacuum defoaming for 20 min to 80 min, e.g., 30 min to 70 min, particularly 40 min to 50 min, so as to improve the uniformity of the resultant film.

The insulation material is one of zirconium dioxide, silicon dioxide, aluminium oxide and barium titanate. In a possible embodiment of the present disclosure, the insulation material is zirconium dioxide. The insulation material has a porous structure with a pore size of 10 nm to 500 nm, e.g., 30 nm to 200 nm, particularly 50 nm to 100 nm. A raw material having an insulation function has a grain size of 10 nm to 500 nm, e.g., 30 nm to 200 nm, particularly 50 nm to 200 nm.

Ethyl cellulose has viscosity of 8 cP to 60 cP, e.g., 10 cP to 55 cP, particularly 10 cP to 46 cP. Ethyl cellulose may be one or more of ethyl cellulose having viscosity of 10 cP, ethyl cellulose having viscosity of 20 cP, ethyl cellulose having viscosity of 46 cP and ethyl cellulose having viscosity of 55 cP. In a possible embodiment of the present disclosure, ethyl cellulose has viscosity of 10 cP or 46 cP, particularly it is a mixture of ethyl cellulose having viscosity of 10 cP and ethyl cellulose having viscosity of 46 cP. A mass ratio of ethyl cellulose having viscosity of 10 cP to ethyl cellulose having viscosity of 46 cP may be 1:0.01 to 1:1, e.g., 1:0.3 to 1:1, particularly 1:0.5 to 1:1. In this way, it is able to adjust the fluidity of the porous insulation layer slurry, thereby to improve the uniformity of the porous insulation layer.

Terpilenol may be one or more of α-terpilenol, β-terpilenol and γ-terpilenol. In a possible embodiment of the present disclosure, terpilenol contains α-terpilenol, or terpilenol is α-terpilenol. A content of α-terpilenol in terpilenol is more than 30 wt %, e.g., more than 80 wt %, particularly more than 90 wt %. The slurry containing α-terpilenol is jelly-like at a room temperature, but it has excellent fluidity when the temperature is greater than 40° C., so it is able to facilitate the formation of the porous insulation layer evenly on the curved-surface conductive substrate.

A mass ratio of the insulation material to ethyl cellulose is 1:0.15 to 1:0.4, e.g., 1:0.2 to 1:0.35, particularly 1:0.25 to 1:0.3, so as to improve the fluidity of the porous insulation layer slurry, thereby to improve the uniformity of the porous insulation layer.

A mass ratio of the insulation material to terpilenol is 1:2 to 1:6, e.g., 1:2 to 1:5, particularly 1:3 to 1:5, so as to improve the fluidity of the porous insulation layer slurry, thereby to improve the uniformity of the porous insulation layer.

A mass ratio of the insulation material to glacial acetic acid is 1:0.05 to 1:1, e.g., 1:0.2 to 1:0.8, particularly 1:0.3 to 1:0.6. Through glacial acetic acid, it is able to improve the dispersibility and the stability of the slurry, thereby to improve the uniformity of the porous insulation layer.

After the porous insulation layer slurry has been applied onto the porous electron transport layer of the first preform, the porous insulation layer slurry may be rested at the room temperature for 3 min to 20 min, e.g., 5 min to 15 min, particularly 10 min to 15 min, and then the second hot melt adhesive may be applied onto the porous insulation layer slurry. Also, the second hot melt adhesive may be applied onto the porous insulation layer slurry, and then rested at the room temperature. In addition, the second hot melt adhesive may be directly applied without any rest at the room temperature. Through the rest, it is able to improve flatness of a surface of the resultant thin film. The second hot melt adhesive may be one of polyurethane, a polyolefin elastomer, polyethersulfone resin, copolyamide, an ethylene-acrylic acid copolymer or an ethylene-vinyl acetate copolymer. In a possible embodiment of the present disclosure, the second hot melt adhesive is polyurethane, e.g., HSL-U60 from Shenzhen Henshenglong Adhesive Product Co., Ltd, XJU-5C from Shanghai Xingxia Polymer Product Co., Ltd, or LV368B-10-FQ from Jiangsu Hehe New Material Co., Ltd. In a possible embodiment of the present disclosure, the second hot melt adhesive is XJU-5C from Shanghai Xingxia Polymer Product Co., Ltd. Through the first second melt adhesive, it is able to firmly attach the porous insulation layer slurry onto the curved-surface conductive substrate, improve the uniformity of the porous insulation layer, facilitate the removal of the second hot melt adhesive film, and prevent the performance of the perovskite solar cell from being adversely affected.

The hot melt adhesive may be dried in a vacuum oven at a temperature of 80° C. to 130° C., e.g., 90° C. to 120° C., particularly 90° C. to 110° C., for 5 min to 20 min, e.g., 10 min to 20 min, particularly 13 min to 17 min. In this way, it is able to dry the second hot melt adhesive into a solid thin film for removal, and facilitate the deposition of the porous insulation layer onto the curved-surface conductive substrate.

In some embodiments of the present disclosure, the second preform with the porous insulation layer is etched through laser to form an etching line P2. The etching line P2 is located at a left side of, and tangent to, the etching line P1, and the etching line P2 has a width of 0.3 mm to 1 mm, e.g., 0.4 mm to 0.7 mm, particularly 0.4 mm to 0.6 mm.

In some embodiments of the present disclosure, the second preform with the porous insulation layer or the etching line P2 is annealed at a temperature of 300° C. to 600° C., e.g., 400° C. to 600° C., particularly 450° C. to 550° C., for 10 min to 60 min, e.g., 20 min to 50 min, particularly 20 min to 40 min, so as to improve the performance of the porous insulation layer.

Step of Forming the Porous Back Electrode Layer

A porous back electrode layer slurry is applied onto the porous insulation layer of the second preform to form a porous back electrode layer, thereby to obtain a third preform with the porous back electrode layer. To be specific, the porous back electrode layer slurry is applied onto the porous insulation layer of the second preform, and then dried to form the porous back electrode layer, thereby to obtain the third preform with the porous back electrode layer.

The porous back electrode layer slurry may be applied onto the porous insulation layer of the second preform through silk-screen printing, slit coating, scraping, ink-jet printing, or spray deposition. In a possible embodiment of the present disclosure, the porous back electrode layer slurry is applied onto the porous insulation layer of the second preform through silk-screen printing. The sill-screen printing may be achieved through a curved-surface silk-screen printer.

The porous back electrode layer slurry may include a porous electrode material, zirconium dioxide, ethyl cellulose and terpilenol. In some embodiments of the present disclosure, the porous back electrode layer slurry may further include glacial acetic acid. The porous back electrode layer slurry may be dispersed through a planetary ball mill, a high speed shearing machine, a sand mill, a rotary and revolutionary mixer, or a nano mill.

The porous electrode material may be one or more of graphite, carbon black, active carbon, graphene, carbon nanotube, FTO, tin-doped indium oxide and aluminium-doped zinc oxide. In a possible embodiment of the present disclosure, the porous electrode material is a mixture of graphite and carbon black. A mass ratio of graphite to carbon black is 1:0.15 to 1:0.5, e.g., 1:0.25 to 1:0.4, particularly 1:0.3 to 1:0.35, and graphite has a particle size of 1 μm to 100 μm, e.g., 5 μm to 50 μm, particularly 10 μm to 20 μm.

Zirconium dioxide is powder, and it has a grain size of 10 nm to 500 nm, e.g., 30 nm to 200 nm, particularly 100 nm to 200 nm. A mass ratio of graphite to zirconium dioxide is 1:0.1 to 1:0.5, e.g., 1:0.1 to 1:0.3, particularly 1:0.15 to 1:0.2. Zirconium dioxide takes a strengthening effect and a curing effect, so it is able to improve the quality of the film after sintering, thereby to improve an electrical property and a filling property of the back electrode layer.

Ethyl cellulose has viscosity of 8 cP to 60 cP, e.g., 10 cP to 55 cP, particularly 10 cP to 46 cP. Ethyl cellulose may be one or more of ethyl cellulose having viscosity of 10 cP, ethyl cellulose having viscosity of 20 cP, ethyl cellulose having viscosity of 46 cP and ethyl cellulose having viscosity of 55 cP. In a possible embodiment of the present disclosure, ethyl cellulose has viscosity of 10 cP or 46 cP, particularly it is a mixture of ethyl cellulose having viscosity of 10 cP and ethyl cellulose having viscosity of 46 cP. A mass ratio of ethyl cellulose having viscosity of 10 cP to ethyl cellulose having viscosity of 46 cP may be 1:0.01 to 1:3, e.g., 1:0.05 to 1:2, particularly 1:0.7 to 1:1.2. A mass ratio of graphite to ethyl cellulose is 1:0.1 to 1:0.5, e.g., 1:0.1 to 1:0.3, particularly 1:0.15 to 1:0.2. In this way, it is able to firmly attach the porous back electrode layer onto the curved-surface conductive substrate, and adjust the fluidity of the porous back electrode layer slurry, thereby to improve the uniformity of the porous back electrode layer.

Terpilenol may be one or more of α-terpilenol, γ-terpilenol and γ-terpilenol. In a possible embodiment of the present disclosure, terpilenol contains α-terpilenol and γ-terpilenol. A mass ratio of α-terpilenol to γ-terpilenol is 1:0.01 to 1:3, e.g., 1:0.5 to 1:2, particularly 1:0.8 to 1:1.3. In this way, it is able to facilitate the formation of the porous back electrode layer evenly on the curved-surface conductive substrate. A mass ratio of graphite to terpilenol is 1:2 to 1:6, e.g., 1:2 to 1:5, particularly 1:3 to 1:5. In this way, it is able to improve the fluidity of the porous back electrode layer slurry, thereby to improve the uniformity of the porous back electrode layer.

A mass ratio of graphite to glacial acetic acid is 1:0.01 to 1:0.6, e.g., 1:0.05 to 1:0.4, particularly 1:0.1 to 1:0.2. Through glacial acetic acid, it is able to improve the dispersibility and the stability of the slurry, thereby to improve the uniformity of the porous back electrode layer.

The porous back electrode layer slurry may be dried in a vacuum oven at a temperature of 80° C. to 130° C., e.g., 90° C. to 120° C., particularly 90° C. to 110° C., for 5 min to 20 min, e.g., 10 min to 20 min, particularly 13 min to 17 min.

In some embodiments of the present disclosure, the third preform with the porous back electrode layer is etched through laser to form an etching line P3. The etching line P3 is located at a left side of, and tangent to, the etching line P2, and the etching line P3 has a width of 0.05 mm to 0.3 mm, e.g., 0.07 mm to 0.14 mm, particularly 0.08 mm to 0.12 mm.

In some embodiments of the present disclosure, the third preform with the porous back electrode layer or the etching line P3 is annealed at a temperature of 300° C. to 600° C., e.g., 300° C. to 500° C., particularly 350° C. to 450° C., for 10 min to 60 min, e.g., 20 min to 50 min, particularly 20 min to 40 min, so as to improve the performance of the porous back electrode layer for the subsequent filling of a perovskite precursor slurry.

Step of Filling the Perovskite Filler

A perovskite precursor slurry is applied onto the porous back electrode layer of the third preform in such a manner that the perovskite precursor slurry is filled in pores of the porous electron transport layer, the porous insulation layer and the porous back electrode layer, thereby to obtain the printable curved-surface perovskite solar cell.

The perovskite precursor slurry includes a compound having a perovskite structure and a solvent. The compound having the perovskite structure is expressed by ABX3 (I), where A is a cation formed by alkylamine, formamidine or an alkali metal, e.g., a cation formed by methylamine, formamidine, caesium or rubidium, particularly a cation formed by methylamine; B is a cation formed by plumbum or tin, e.g., a cation formed by plumbum; and X is an anion formed by iodine, bromine, chlorine or pseudo halogen, e.g., an iodide ion. Examples of pseudo halogen include, but not limited to, CN, SCN, SeCN, OCN and SCSN. In a possible embodiment of the present disclosure, a compound having a perovskite structure is $CH_3NH_3PbI_3$. The solvent is one or more of γ-butyrolactone, N,N-dimethylformamide, N-methylformamide, methyl pyrrolidone or dimethylsulfoxide. In a possible embodiment of the present disclosure, the solvent is one or more of γ-butyrolactone, N,N-dimethylformamide and N-methylformamide, e.g., the solvent is γ-butyrolactone. A mass percentage of a solute in the perovskite precursor slurry is 15 wt % to 45 wt %, e.g., 20 wt % to 40 wt %, particularly 25 wt % to 35 wt %.

The perovskite precursor slurry may be applied onto the porous back electrode layer of the third preform through dispensing. After the perovskite precursor slurry has been filled in the pores of the porous electron transport layer, the porous insulation layer and the porous back electrode layer, the perovskite precursor slurry is annealed at a temperature of 50° C. to 150° C., e.g., 50° C. to 100° C., particularly 50° C. to 70° C., for 0.5 h to 24 h, e.g., 1 h to 12 h, particularly 6 h to 12 h.

Packaging Step

A hot melt adhesive film is applied onto the porous back electrode layer of the printable curved-surface perovskite solar cell, then a flexible back plate is placed thereon, and then vacuum laminating is performed to package the printable curved-surface perovskite solar cell. The flexible back plate is a flexible functional film having a water-proof and insulation function. The hot melt adhesive film may be made of polyurethane or an ethylene-vinyl acetate copolymer, and it may have a thickness of 0.3 mm to 0.8 mm. The vacuum laminating is performed at a temperature of 90° C. to 120° C. for 5 min to 15 min.

According to the embodiments of the present disclosure, through adjusting types of terpilenol and ethyl cellulose as well as the contents thereof, it is able to increase the viscosity of the slurry at the room temperature, and provide the slurry with excellent fluidity at a printing temperature, thereby to improve the controllability when the curved-surface thin film is printed. In addition, the printed curved-surface thin film is attached through the hot melt adhesive, so it is able to improve the uniformity of the film.

The present disclosure will be described hereinafter in more details in conjunction with specific examples.

In the following examples and a comparative example, a hot melt adhesive is XJU-5C from Shanghai Xingxia Polymer Product Co., Ltd, a curved-surface silk-screen printer is ATMAOE67 from Dongyuan Machine (Kunshan) Co., Ltd, a nanosecond laser is ET660 from Wuhan Tuopuyin Photoelectric Technology Co., Ltd, a femtosecond laser is ETG1370 from Wuhuan Yuanlu Photoelectric Technology Co., Ltd, the curved-surface conductive substrate includes a curved-surface transparent glass substrate and a FTO conductive layer deposited thereon, a titanium dioxide slurry is NR-30 from Greatcellsolar and has a grain size of 30 nm, zirconium dioxide power has a grain size of 50 nm, and graphite has a particle size of 15 μm.

EXAMPLE 1

Figure 2:
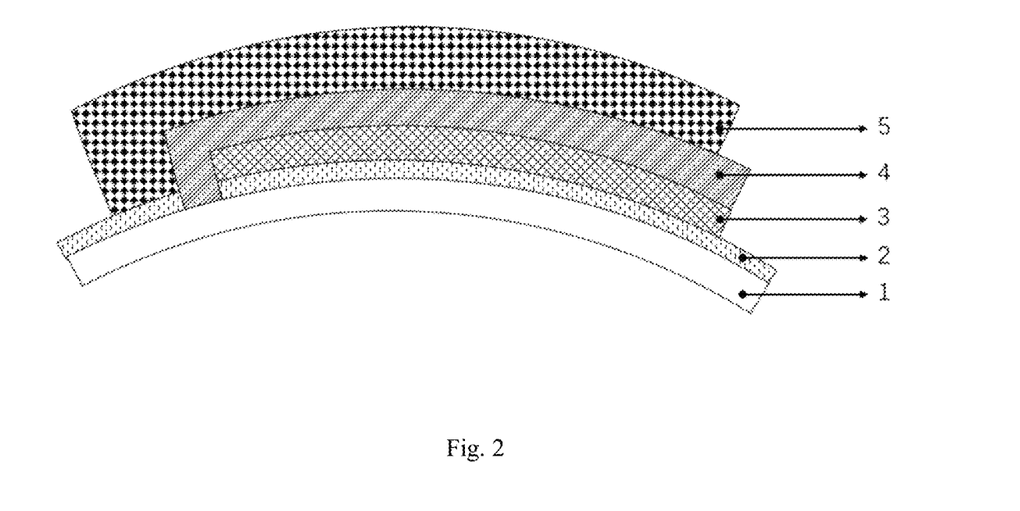
FIG. 2 is a schematic view showing a structure of the printable curved-surface perovskite solar cell obtained according to one embodiment of the present disclosure.

FIG. 2 shows a structure of the printable curved-surface perovskite solar cell, which includes a curved-surface conductive substrate. The curved-surface conductive substrate includes a curved-surface transparent substrate 1 and a conductive layer deposited on the curved-surface transparent substrate 1. A porous electron transport layer 3, a porous insulation layer 4 and a porous back electrode layer 5 are deposited sequentially on the conductive layer 2 from bottom to top. A perovskite filler is filled in pores of the porous electron transport layer 2, the porous insulation layer 3 and the porous back electrode layer 4. The printable curved-surface perovskite solar cell is prepared as follows.

(1) The curved-surface conductive substrate is immersed into a detergent Hellmanex®III for ultrasonic cleaning for 15 min, and then immersed into alcohol for ultrasonic cleaning for 10 min. The cleaned curved-surface conductive substrate is dried at a temperature of 55° C., and then fixed onto a copying jig through vacuum adsorption. The conductive layer of the curved-surface conductive substrate is etched through the nanosecond laser to form an etching line P1 having a width of 0.08 mm. The curved-surface conductive substrate with the etching line P1 is immersed into deionized water for ultrasonic cleaning for 15 min, then immersed into alcohol for ultrasonic cleaning for 5 min, and then dried at a temperature of 60° C. until no water and spot-like impurities remain on a surface thereof. Then, the curves-surface conductive substrate with the etching line P1 is treated through ultraviolet light and ozone for 15 min.

(2) Raw materials of a porous electron transport layer slurry are mixed, and subjected to vacuum defoaming for 45 min to obtain the porous electron transport layer slurry. Table 1 shows constituents of the porous electron transport layer slurry. The porous electron transport layer slurry is printed onto the conductive layer of the curved-surface conductive substrate with the etching line P1 through the silk-screen curved-surface printer. The curved-surface conductive substrate with the porous electron transport layer slurry is rested at a room temperature for 10 min, and then the hot melt adhesive, i.e., polyurethane, is evenly applied onto the porous electron transport layer slurry. Next, the curved-surface conductive substrate is dried in a vacuum oven at a temperature of 100° C. for 15 min. Then, a polyurethane film is peeled off to obtain a first preform with the porous electron transport layer. Finally, the first preform with the porous electron transport layer is annealed at a temperature of 500° C. for 30 min.

TABLE 1 constituents of the porous electron transport layer slurry

|  | Example 1 | Example 2 | Example 3 |
|---|---|---|---|
| Solvent | α-terpilenol | γ-terpilenol | α-terpilenol |
| Solid content of $TiO_2$ (wt %) | 4.5 | 4.5 | 4.5 |

(3) Raw materials of a porous insulation layer slurry are dispersed evenly through a planetary ball mill, and subjected to vacuum defoaming for 45 min, so as to obtain the porous insulation layer slurry. Table 2 shows constituents of the porous insulation layer slurry. The porous insulation layer slurry is printed onto the porous electron transport layer of the first preform through a silk-screen curved-surface printer. The first preform with the porous insulation layer slurry is rested at a room temperature for 10 min, and then the hot melt adhesive, i.e., polyurethane, is evenly applied onto the porous insulation layer slurry. Next, the first preform is dried in a vacuum oven at a temperature of 100° C. for 15 min. Then, a polyurethane film is peeled off to obtain a second preform with the porous insulation layer.

TABLE 2 constituents of the porous insulation layer slurry

|  | Example 1 | Example 2 | Example 3 |
|---|---|---|---|
| $ZrO_2$ powder (parts by weight) | 1 | 1 | 1 |
| ethyl cellulose (having viscosity of 10cP) (parts by weight) | 0.2 | — | 0.2 |
| ethyl cellulose (having viscosity of 46cP) (parts by weight) | 0.1 | 0.3 | 0.1 |
| α-terpilenol (parts by weight) | 4 | — | 4 |
| γ-terpilenol (parts by weight) | — | 4 | — |
| glacial acetic acid (parts by weight) | 0.5 | 1 | 0.5 |

(4) A porous back electrode layer slurry is dispersed through a planetary ball mill, and Table 3 shows constituents of the porous back electrode layer slurry. The porous back electrode layer slurry is printed onto the porous insulation layer of the second preform through a silk-screen curved-surface printer, and then dried in a vacuum oven at a temperature of 100° C. for 15 min, so as to obtain a third preform with a porous back electrode layer. The third preform with the porous back electrode layer is annealed at a temperature of 400° C. for 30 min, and then cooled to the room temperature.

TABLE 3

Constituents of the porous back electrode layer slurry

|  | Example 1 | Example 2 | Example 3 |
|---|---|---|---|
| graphite powder (parts by weight) | 1 | 1 | 1 |
| carbon black powder (parts by weight) | 0.3 | 0.35 | 0.3 |
| $ZrO_2$ powder (parts by weight) | 0.15 | 0.2 | 0.15 |
| ethyl cellulose (having viscosity of 10cP) (parts by weight) | 0.1 | — | 0.1 |
| ethyl cellulose (having viscosity of 46cP) (parts by weight) | 0.05 | 0.15 | 0.05 |
| α-terpilenol (parts by weight) | 2 | — | 2 |
| γ-terpilenol (parts by weight) | 2 | 4 | 2 |
| glacial acetic acid (parts by weight) | 0.15 | 0.3 | 0.15 |

(5) A precursor slurry (with a solvent as γ-butyrolactone and a solute having a mass percentage of 30 wt %), i.e., $CH_3NH_3PbI_3$, is applied onto the porous back electrode layer through dispensing in such a manner that it fills into pores of the porous electron transport layer, the porous insulation layer and the porous back electrode layer. Then, a resultant product is annealed at a temperature of 50° C. for 10 h to obtain the printable curved-surface perovskite solar cell, as shown in FIG. 1.

(6) A polyurethane film (at a thickness of 0.5 mm) is applied onto the porous back electrode layer of the printable curved-surface perovskite solar cell. Then, a flexible back plate is placed thereonto, and pressed at a temperature of 110° C. for 15 min, so as to package the printable curved-surface perovskite solar cell.

EXAMPLE 2

Example 2 differs from Example 1 in Steps (2) and (3). To be specific, in Example 2, the method includes the following steps.

(1) The curved-surface conductive substrate is immersed into a detergent Hellmanex®III for ultrasonic cleaning for 15 min, and then immersed into alcohol for ultrasonic cleaning for 10 min. The cleaned curved-surface conductive substrate is dried at a temperature of 55° C., and then fixed onto a copying jig through vacuum adsorption. The conductive layer of the curved-surface conductive substrate is etched through the nanosecond laser to form an etching line P1 having a width of 0.08 mm. The curved-surface conductive substrate with the etching line P1 is immersed into deionized water for ultrasonic cleaning for 15 min, then immersed into alcohol for ultrasonic cleaning for 5 min, and then dried at a temperature of 60° C. until no water and spot-like impurities remain on a surface thereof. Then, the curves-surface conductive substrate with the etching line P1 is treated through ultraviolet light and ozone for 15 min.

(2) Raw materials of a porous electron transport layer slurry are mixed, and subjected to vacuum defoaming for 45 min to obtain the porous electron transport layer slurry. Table 1 shows constituents of the porous electron transport layer slurry. The porous electron transport layer slurry is printed onto the conductive layer of the curved-surface conductive substrate with the etching line P1 through the silk-screen curved-surface printer. The hot melt adhesive, i.e., polyurethane, is evenly applied onto the porous electron transport layer slurry. Next, the curved-surface conductive substrate is dried in a vacuum oven at a temperature of 100° C. for 15 min. Then, a polyurethane film is peeled off to obtain a first preform with the porous electron transport layer. Finally, the first preform with the porous electron transport layer is annealed at a temperature of 500° C. for 30 min.

(3) Raw materials of a porous insulation layer slurry are dispersed evenly through a planetary ball mill, and subjected to vacuum defoaming for 45 min, so as to obtain the porous insulation layer slurry. Table 2 shows constituents of the porous insulation layer slurry. The porous insulation layer slurry is printed onto the porous electron transport layer of the first preform through a silk-screen curved-surface printer. The hot melt adhesive, i.e., polyurethane, is evenly applied onto the porous insulation layer slurry. Next, the first preform is dried in a vacuum oven at a temperature of 100° C. for 15 min. Then, a polyurethane film is peeled off to obtain a second preform with the porous insulation layer.

(4) A porous back electrode layer slurry is dispersed through a planetary ball mill, and Table 3 shows constituents of the porous back electrode layer slurry. The porous back electrode layer slurry is printed onto the porous insulation layer of the second preform through a silk-screen curved-surface printer, and then dried in a vacuum oven at a temperature of 100° C. for 15 min, so as to obtain a third preform with a porous back electrode layer. The third preform with the porous back electrode layer is annealed at a temperature of 400° C. for 30 min, and then cooled to the room temperature.

(5) A precursor slurry (with a solvent as γ-butyrolactone and a solute having a mass percentage of 30 wt %), i.e., $CH_3NH_3PbI_3$, is applied onto the porous back electrode layer through dispensing in such a manner that it fills into pores of the porous electron transport layer, the porous insulation layer and the porous back electrode layer. Then, a resultant product is annealed at a temperature of 50° C. for 10 h to obtain the printable curved-surface perovskite solar cell, as shown in FIG. 1.

(6) A polyurethane film (at a thickness of 0.5 mm) is applied onto the porous back electrode layer of the printable curved-surface perovskite solar cell. Then, a flexible back plate is placed thereonto, and pressed at a temperature of 110° C. for 15 min, so as to package the printable curved-surface perovskite solar cell. In Example 2, each of the porous electron transport layer slurry and the porous insulation layer slurry has relatively low viscosity at the room temperature. After the application of the slurry, when it is rested at the room temperature, it may flow along a curved surface of the substrate, and thereby the formation of the thin film may be adversely affected. Hence, in Example 2, the step of resting the slurry at the room temperature may be omitted. However, at this time, the resultant thin film may have a rough surface, i.e., the flatness of the thin film may be deteriorated.

EXAMPLE 3

Example 3 differs from Example 1 in Steps (3) and (4). To be specific, in Example 3, the method includes the following steps.

(1) The curved-surface conductive substrate is immersed into a detergent Hellmanex®III for ultrasonic cleaning for 15 min, and then immersed into alcohol for ultrasonic cleaning for 10 min. The cleaned curved-surface conductive substrate is dried at a temperature of 55° C., and then fixed onto a copying jig through vacuum adsorption. The conductive layer of the curved-surface conductive substrate is etched through the nanosecond laser to form an etching line P1 having a width of 0.08 mm. The curved-surface conductive substrate with the etching line P1 is immersed into deionized water for ultrasonic cleaning for 15 min, then immersed into alcohol for ultrasonic cleaning for 5 min, and then dried at a temperature of 60° C. until no water and spot-like impurities remain on a surface thereof. Then, the curves-surface conductive substrate with the etching line P1 is treated through ultraviolet light and ozone for 15 min.

(2) Raw materials of a porous electron transport layer slurry are mixed, and subjected to vacuum defoaming for 45 min to obtain the porous electron transport layer slurry. Table 1 shows constituents of the porous electron transport layer slurry. The porous electron transport layer slurry is printed onto the conductive layer of the curved-surface conductive substrate with the etching line P1 through the silk-screen curved-surface printer. The curved-surface conductive substrate with the porous electron transport layer slurry is rested at a room temperature for 10 min, and then the hot melt adhesive, i.e., polyurethane, is evenly applied onto the porous electron transport layer slurry. Next, the curved-surface conductive substrate is dried in a vacuum oven at a temperature of 100° C. for 15 min. Then, a polyurethane film is peeled off to obtain a first preform with the porous electron transport layer. Finally, the first preform with the porous electron transport layer is annealed at a temperature of 500° C. for 30 min.

(3) Raw materials of a porous insulation layer slurry are dispersed evenly through a planetary ball mill, and subjected to vacuum defoaming for 45 min, so as to obtain the porous insulation layer slurry. Table 2 shows constituents of the porous insulation layer slurry. The porous insulation layer slurry is printed onto the porous electron transport layer of the first preform through a silk-screen curved-surface printer. The first preform with the porous insulation layer slurry is rested at a room temperature for 10 min, and then the hot melt adhesive, i.e., polyurethane, is evenly applied onto the porous insulation layer slurry. Next, the first preform is dried in a vacuum oven at a temperature of 100° C. for 15 min. Then, a polyurethane film is peeled off to obtain a second preform with the porous insulation layer. Finally, the second preform is etched through a femtosecond laser to form an etching line P2. The etching line P2 is located at a left side of, and tangent to, the etching line P1, and it has a width of 0.5 mm.

(4) A porous back electrode layer slurry is dispersed through a planetary ball mill, and Table 3 shows constituents of the porous back electrode layer slurry. The porous back electrode layer slurry is printed onto the porous insulation layer of the second preform through a silk-screen curved-surface printer, and then dried in a vacuum oven at a temperature of 100° C. for 15 min, so as to obtain a third preform with a porous back electrode layer. The third preform is etched through a femtosecond laser to form an etching line P3. The etching line P3 is located at a left side of, and tangent to, the etching line P2, and it has a width of 0.1 mm. The third preform with the etching line P3 is annealed at a temperature of 400° C. for 30 min, and then cooled to the room temperature.

(5) A precursor slurry (with a solvent as γ-butyrolactone and a solute having a mass percentage of 30 wt %), i.e., $CH_3NH_3PbI_3$, is applied onto the porous back electrode layer through dispensing in such a manner that it fills into pores of the porous electron transport layer, the porous insulation layer and the porous back electrode layer. Then, a resultant product is annealed at a temperature of 50° C. for 10 h to obtain the printable curved-surface perovskite solar cell.

(6) A polyurethane film (at a thickness of 0.5 mm) is applied onto the porous back electrode layer of the printable curved-surface perovskite solar cell. Then, a flexible back plate is placed thereonto, and pressed at a temperature of 110° C. for 15 min, so as to package the printable curved-surface perovskite solar cell.

COMPARATIVE EXAMPLE 1

Comparative Example 1 differs from Example 1 in that the step of applying the hot melt adhesive, i.e., polyurethane, evenly onto the porous electron transport layer slurry is omitted. To be specific, the method includes the following steps.

(1) The curved-surface conductive substrate is immersed into a detergent Hellmanex®III for ultrasonic cleaning for 15 min, and then immersed into alcohol for ultrasonic cleaning for 10 min. The cleaned curved-surface conductive substrate is dried at a temperature of 55° C., and then fixed onto a copying jig through vacuum adsorption. The conductive layer of the curved-surface conductive substrate is etched through the nanosecond laser to form an etching line P1 having a width of 0.08 mm. The curved-surface conductive substrate with the etching line P1 is immersed into deionized water for ultrasonic cleaning for 15 min, then immersed into alcohol for ultrasonic cleaning for 5 min, and then dried at a temperature of 60° C. until no water and spot-like impurities remain on a surface thereof. Then, the curves-surface conductive substrate with the etching line P1 is treated through ultraviolet light and ozone for 15 min.

(2) Raw materials of a porous electron transport layer slurry are mixed, and subjected to vacuum defoaming for 45 min to obtain the porous electron transport layer slurry. Table 1 shows constituents of the porous electron transport layer slurry. The porous electron transport layer slurry is printed onto the conductive layer of the curved-surface conductive substrate with the etching line P1 through the silk-screen curved-surface printer. The curved-surface conductive substrate with the porous electron transport layer slurry is rested at a room temperature for 10 min, and then dried in a vacuum oven at a temperature of 100° C. for 15 min.

The porous electron transport layer slurry has relatively low viscosity at the temperature of 100° C. The conductive substrate has a curved surface, and in the case of no polyurethane, the slurry may flow along the curved surface. After the drying, it is impossible to form a thin film on the curved-surface conductive substrate. At this time, it is impossible to obtain the first preform with the porous electron transport layer, let alone with the curved-surface perovskite solar cell.

TEST EXAMPLE 1.1 Test About Viscosity of Slurry

Figure 3:
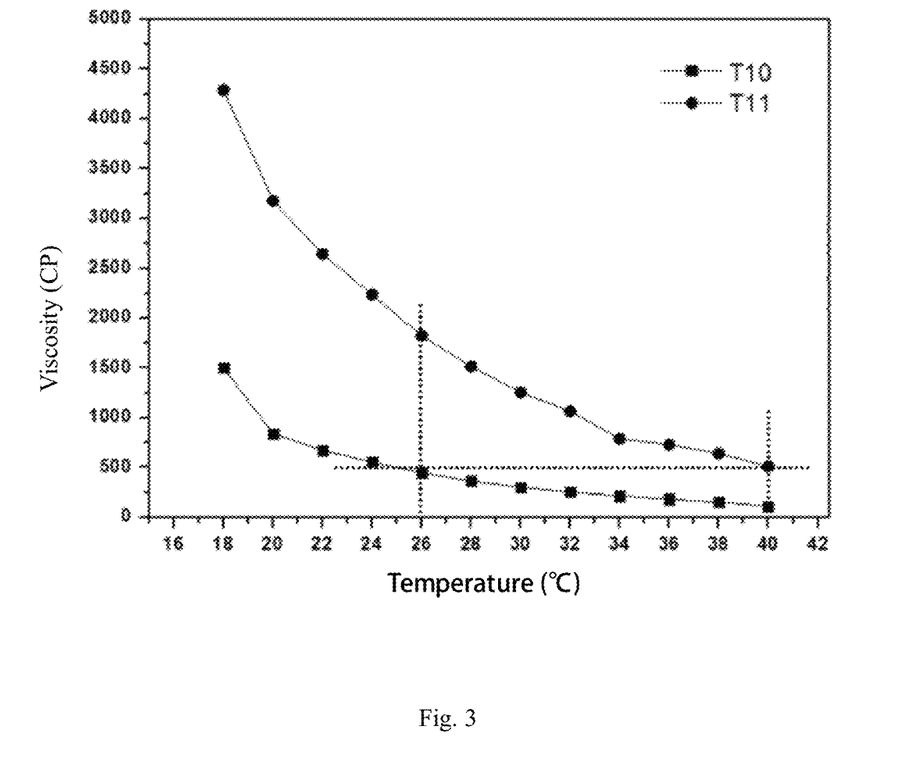
FIG. 3 is a curve diagram showing viscosity of a porous electron transport layer slurry along with a change in temperature according to Examples 1 and 2 of the present disclosure.
Figure 4:
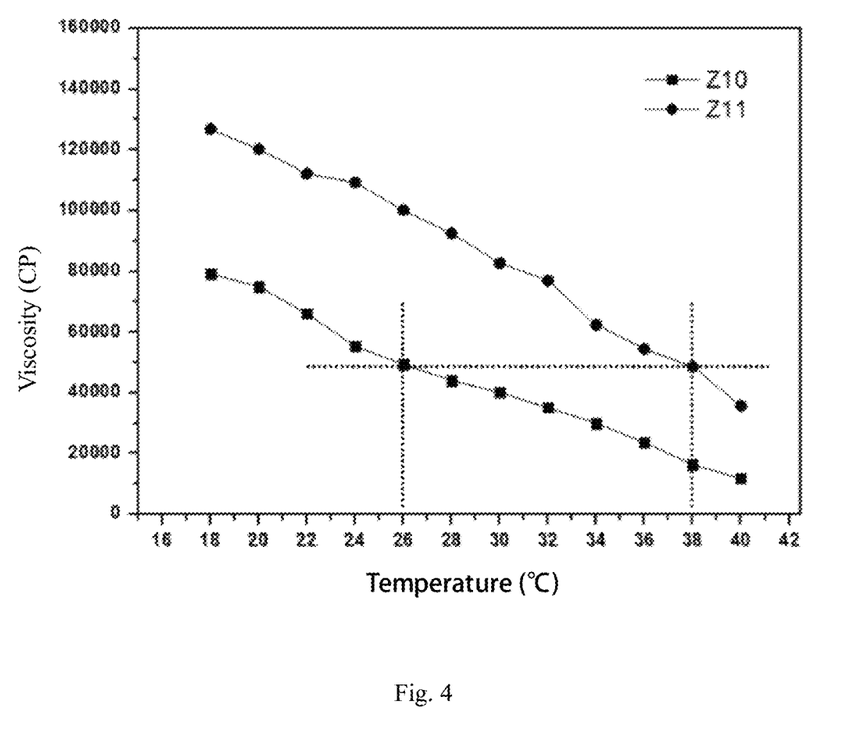
FIG. 4 is a curve diagram showing viscosity of a porous insulation layer slurry along with a change in temperature according to Examples 1 and 2 of the present disclosure.

The viscosity of the slurries is tested at a temperature of 18° C. to 40° C. through Brookfield DV2TLV, and FIGS. 3 and 4, where T11 represents the porous electron transport layer slurry in Example 1, T10 represents the porous electron transport layer slurry in Example 2, Z11 represents the porous insulation layer slurry in Example 1, and Z10 represents the porous insulation layer slurry in Example 2.

As shown in FIG. 3, the porous electron transport layer slurry is more susceptible to a change in the temperature, and when the temperature increases, the viscosity of the porous electron transport layer slurry decreases. When the temperature increases to 40° C., the viscosity of T10 is merely 110 cP and the viscosity of T11 is about 510 cP. At this time, the fluidity of T10 and T11 meets a curved-surface printing condition, but T11 is more controllable for the uniformity of the resultant film. At a room temperature (25° C.), the viscosity of T10 is about 450 cP and the viscosity of T11 is about 1800 cP. In other words, the viscosity of T11 increases remarkably, and its fluidity decreases significantly, so it is able to improve the controllability of the thin film at the room temperature, thereby to form the thin film more evenly.

As shown in FIG. 4, the porous insulation layer slurry is more susceptible to a change in the temperature, and when the temperature increases, the viscosity of the porous insulation layer slurry decreases. When the temperature increases to 38° C., the viscosity of Z11 is about 50000 cP, i.e., its fluidity is far less than that of Z10, so it is able to meet the curved-surface printing condition and improve the controllability of the thin film. At the room temperature (25° C.), the viscosity of Z11 is about 100000 cP and the viscosity of Z10 is about 50000 cP, i.e., the viscosity of Z11 is about twice of the viscosity of Z10. At this time, it is able to control the thin film formed by Z11, thereby to improve the uniformity of the thin film.

1.2 Test About Thickness of Porous Electron Transport Layer

The first preform is cooled down to the room temperature, a 10 cm*10 cm portion is selected from a surface of the first preform, a grid is etched on the portion through the femtosecond laser, and then a thickness of the porous electron transport layer is tested through a probe-type step profiler (Dektak XT) from Bruker. Then, a three-dimensional profile of the porous electron transport layer is obtained in accordance with data about the thickness of the porous electron transport layer.

Figure 5:
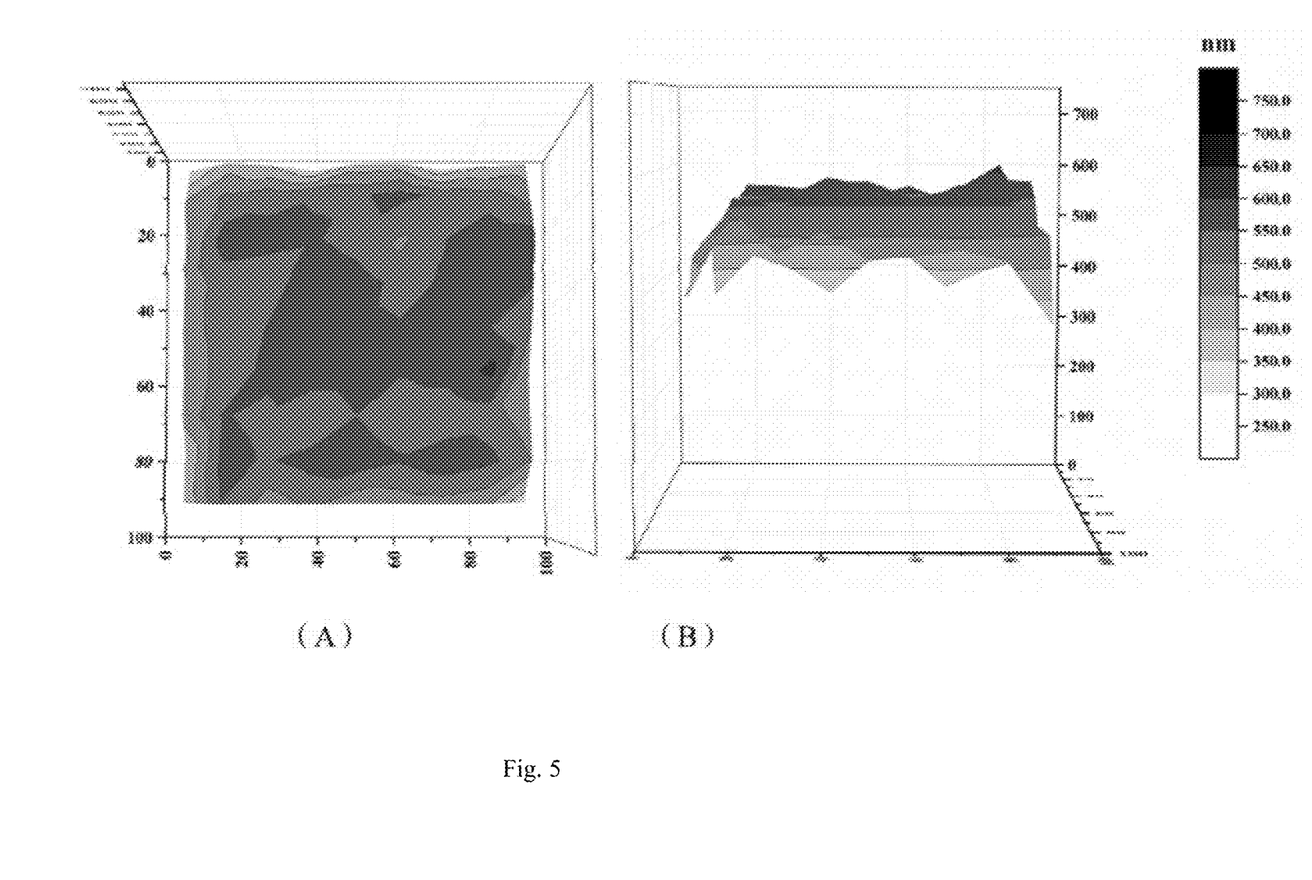
FIG. 5 is a three-dimensional profile of the porous electron transport layer according to Example 1 of the present disclosure, wherein (A) is a top view thereof and (B) is a front view thereof.
Figure 6:
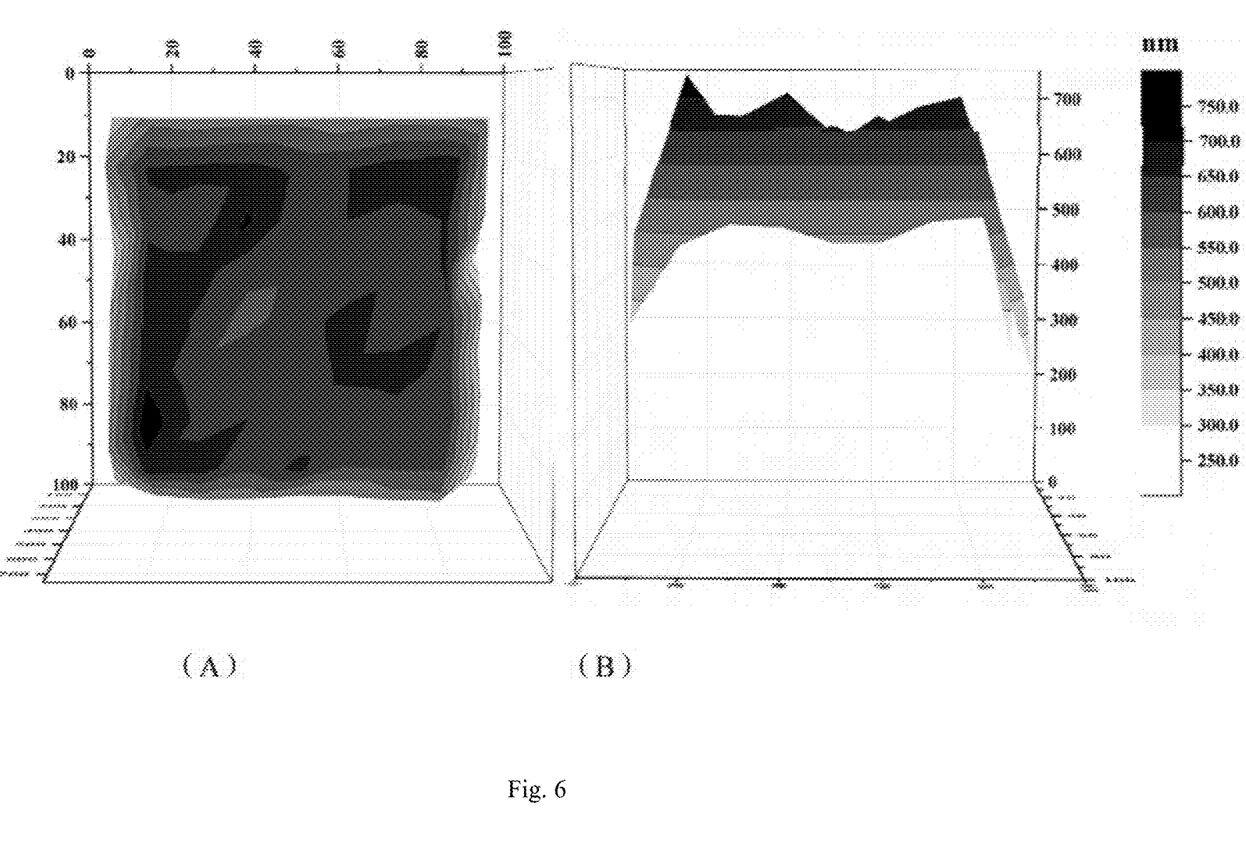
FIG. 6 is the three-dimensional profile of the porous electron transport layer according to Example 2 of the present disclosure, wherein (A) is a top view thereof and (B) is a front view thereof.

FIG. 5 shows the three-dimensional profile of the porous electron transport layer in Example 1, and FIG. 6 shows the three-dimensional profile of the porous electron transport layer in Example 2.

As shown in FIGS. 5 and 6, the porous electron transport layer in Example 1 has a thickness of about 550 nm, and it has a relatively flat surface, so the thin film has excellent uniformity. The porous electron transport layer in Example 2 has a thickness of about 600 nm, and it has a rough surface. A difference between the thickness at a peripheral position, i.e., merely 300 nm, and the thickness at a middle portion, is greater than 300 nm.

1.3 Test About Thickness of Porous Insulation Layer

The second preform is cooled down to the room temperature, a 10 cm*10 cm portion is selected from a surface of the second preform, a grid is etched on the portion through the femtosecond laser, and then a thickness of the porous insulation layer is tested through second probe-type step profiler (Dektak XT) from Bruker. Then, a three-dimensional profile of the porous insulation layer is obtained in accordance with data about the thickness of the porous insulation layer.

Figure 7:
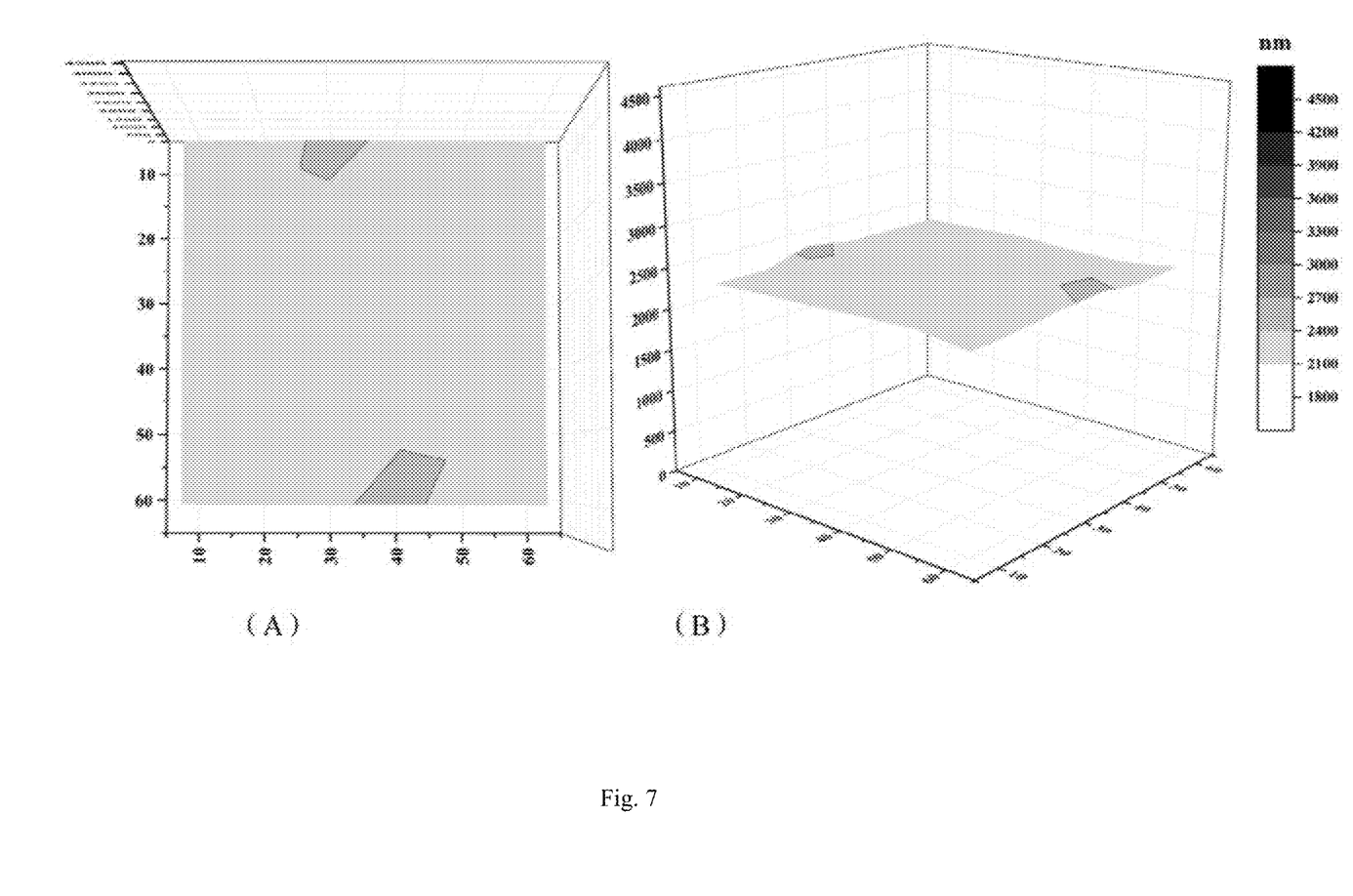
FIG. 7 is a three-dimensional profile of the porous insulation layer according to Example 1 of the present disclosure, wherein (A) is a top view thereof and (B) is a front view thereof.
Figure 8:
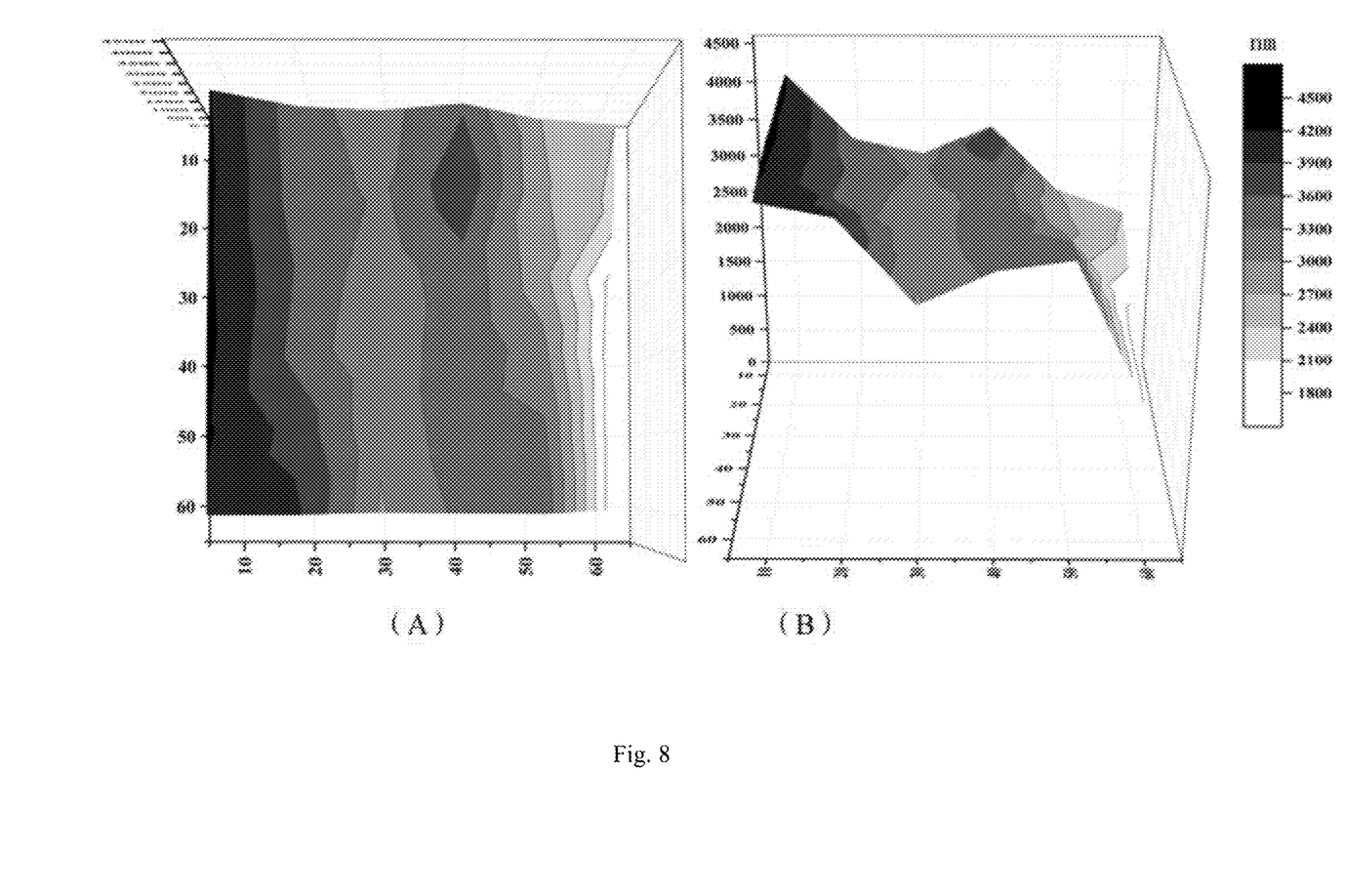
FIG. 8 is a the three-dimensional profile of the porous insulation layer according to Example 2 of the present disclosure, wherein (A) is a top view thereof and (B) is a front view thereof.

FIG. 7 shows the three-dimensional profile of the porous insulation layer in Example 1, and FIG. 8 shows the three-dimensional profile of the porous insulation layer in Example 2.

As shown in FIGS. 7 and 8, the porous insulation layer in Example 1 has a thickness of about 2.2 μm, and it has a relatively flat surface, so the thin film has excellent uniformity. The porous insulation layer in Example 2 has a thickness of about 2.0 μm to 4.0 μm, and it has a rough surface. This is mainly because the slurry has excellent fluidity. To be specific, the porous insulation layer has a thickness of 4.0 μm at a peripheral position and a thickness of 2.0 μm at a middle position, with a difference greater than 2.0 μm.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A method for preparing a printable curved-surface perovskite solar cell, wherein the printable curved-surface perovskite solar cell comprises a curved-surface conductive substrate, a porous electron transport layer, a porous insulation layer, a porous back electrode layer and a perovskite filler; the curved-surface conductive substrate comprises a curved-surface transparent substrate and a conductive layer deposited on the curved-surface transparent substrate; the porous electron transport layer, the porous insulation layer and the porous back electrode layer are sequentially deposited on the conductive layer from bottom to top; and the perovskite filler is filled in pores of the porous electron transport layer, the porous insulation layer and the porous back electrode layer; and the method comprises:

(1) etching a cleaned curved-surface conductive substrate through laser to form an etching line P1;

(2) applying a porous electron transport layer slurry onto a conductive layer of the curved surface conductive substrate with the etching line P1, applying a first hot melt adhesive onto the porous electron transport layer slurry to form a first hot melt adhesive film, and peeling off the first hot melt adhesive film to obtain a first preform with a porous electron transport layer;

(3) applying a porous insulation layer slurry onto the porous electron transport layer of the first preform, applying a second hot melt adhesive onto the porous insulation layer slurry to form a second hot melt adhesive film, and peeling off the second hot melt adhesive film to obtain a second preform with a porous insulation layer;

(4) applying a porous back electrode layer slurry onto the porous insulation layer of the second preform to form a porous back electrode layer, thereby to obtain a third preform with the porous back electrode layer; and (5) applying a perovskite precursor slurry onto the porous back electrode layer of the third preform in such a manner that the perovskite precursor slurry is filled in pores of the porous electron transport layer, the porous insulation layer and the porous back electrode layer, to obtain the printable curved-surface perovskite solar cell.

2. The method according to claim 1, wherein the first hot melt adhesive and the second hot melt adhesive are each independently selected from polyurethane, a polyolefin elastomer, polyethersulfone resin, copolyamide, an ethylene-acrylic acid copolymer or an ethylene-vinyl acetate copolymer.

3. The method according to claim 1, wherein the porous electron transport layer slurry comprises an electron transport material and terpilenol, and a solid content of the electron transport material is 2 wt % to 10 wt % in the porous electron transport layer slurry;

terpilenol contains α-terpilenol, and a content of α-terpilenol in terpilenol is more than 30 wt %; and the electron transport material is one or more selected from a group consisting of titanium dioxide, tin dioxide, zinc oxide and barium stannate.

4. The method according to claim 1, wherein the porous insulation layer slurry comprises an insulation material, ethyl cellulose and terpilenol, a mass ratio of the insulation material to ethyl cellulose is 1:0.15 to 1:0.4, a mass ratio of the insulation material to terpilenol is 1:2 to 1:6, the insulation material is one or more selected from the group consisting of zirconium dioxide, silicon dioxide, aluminium oxide and barium titanate, terpilenol contains α-terpilenol, and a content of α-terpilenol in terpilenol is more than 30 wt %;

the porous back electrode layer slurry comprises graphite, carbon black, zirconium dioxide, ethyl cellulose and terpilenol; and a mass ratio of graphite to carbon black is 1:0.15 to 1:0.5, a mass ratio of graphite to zirconium dioxide is 1:0.1 to 1:0.5, a mass ratio of graphite to ethyl cellulose is 1:0.1 to 1:0.5, and a mass ratio of graphite to terpilenol is 1:2 to 1:6.

5. The method according to claim 4, wherein the porous insulation layer slurry further comprises glacial acetic acid, a mass ratio of the insulation material to glacial acetic acid is 1:0.05 to 1, the porous back electrode layer slurry further comprises glacial acetic acid, and a mass ratio of graphite to glacial acetic acid is 1:0.01 to 0.6.

6. The method according to claim 1, further comprising, prior to (3), annealing the first preform with the porous electron transport layer at a temperature of 300° C. to 600° C. for 10 min to 60 min.

7. The method according to claim 1, further comprising etching the second preform with the porous insulation layer through laser to form an etching line P2, wherein the etching line P2 is located at a left side of, and tangent to, the etching line P1, and the etching line P2 has a width of 0.3 mm to 1 mm.

8. The method according to claim 7, further comprising etching the third preform with the porous back electrode layer through layer to form an etching line P3, and annealing the third preform at a temperature of 300° C. to 600° C. for 10 min to 60 min, wherein the etching line P3 is located at a left side of, and tangent to, the etching line P2, and the etching line P3 has a width of 0.05 mm to 0.3 mm.

* * * * *